(12) United States Patent
Brask

(10) Patent No.: US 6,770,568 B2
(45) Date of Patent: Aug. 3, 2004

(54) SELECTIVE ETCHING USING SONICATION

(75) Inventor: Justin K. Brask, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/242,740

(22) Filed: Sep. 12, 2002

(65) Prior Publication Data
US 2004/0053503 A1 Mar. 18, 2004

(51) Int. Cl.[7] .......................................... H01L 21/302
(52) U.S. Cl. ............................................... 438/746
(58) Field of Search .............................. 438/746, 745, 438/753, 776

(56) References Cited

U.S. PATENT DOCUMENTS 4,681,657 A * 7/1987 Hwang et al. .............. 438/753
5,057,184 A * 10/1991 Gupta et al. ................ 156/637
5,821,175 A * 10/1998 Engelsberg ................. 438/795
6,322,954 B1 * 11/2001 Li .............................. 430/313

OTHER PUBLICATIONS

Brask et al., U.S. patent application Ser. No. 10/210,461, filed Jul. 31, 2002, entitled "Selective Etching of Polysilicon".

* cited by examiner

Primary Examiner—David Nelms
Assistant Examiner—Quoc Hoang
(74) Attorney, Agent, or Firm—Trop, Pruner & Hu, P.C.

(57) ABSTRACT

To provide for increased differentiation in etch rates, sonication may be used during etching. Such sonication may alter the relative etch rates of portions of a desired layer.

25 Claims, 2 Drawing Sheets

SELECTIVE ETCHING USING SONICATION

BACKGROUND

This invention relates generally to selectively etching one material with respect to other materials.

In a variety of different circumstances, it may be desirable to etch polysilicon selectively. That is, it may be desirable to preferentially etch polysilicon while reducing the etching of other materials.

One example of a situation where such selectivity may be desirable is in connection with providing dual metal gate technology. Dual polysilicon gates are used in conventional complementary metal oxide semiconductor (CMOS) devices to engineer a desired threshold voltage that may be different between the NMOS and PMOS devices. Unfortunately, as the device's scale becomes smaller, this approach is not effective. When the polysilicon doping level is not sufficiently high, the polysilicon gate depletion effectively increases the gate dielectric thickness by several Angstroms. This negatively impacts the ability to scale gate dielectric thicknesses. Boron penetration and gate resistance may also be issues for such polysilicon gate technology.

One approach to this problem is to replace the polysilicon gate with a metal gate. More particularly, one metal gate may be utilized for the NMOS devices and a different metal gate may be utilized for the PMOS devices.

Thus, it may be desirable to form dual metal gate technology from conventional processing steps that use polysilicon. After the polysilicon has been defined to form the gate electrodes for a transistor, the polysilicon may be selectively removed. A different metal may be applied to form each of the NMOS and PMOS transistors.

Thus, there is a need for a better way to selectively etch materials.

DETAILED DESCRIPTION

Sonication during the polysilicon etching process may increase etch selectivity. In one embodiment, the sonication may be ultrasonic, namely the application of sonic energy in the frequency range between approximately 10 kilohertz (kHz) and 100 kHz. In a second embodiment, the sonication may be megasonic, namely the application of sonic energy in the frequency range between approximately 500–1000 kHz.

In one embodiment, the etch selectivity between p+ and n+ doped polysilicon regions may be significantly increased via sonication. For example, the etch rate of the n+ doped region may be as much as an order of magnitude greater, or more, depending on the actual power of sonication employed, than that of p+ doped or intrinsic polysilicon.

In one embodiment of a process according to the present invention, wet etching may be performed using sonics to improve etch selectivity. Such a wet etch may be performed by immersing a wafer in an etchant. For example, the wafer (or wafers) may be immersed in a tank, such as a chemical bath, that is equipped for sonication. The equipment for sonication may vary, but in one embodiment using ultrasonics or megasonics transducers located external to the tank may be used to provide sonic waves at the desired frequency.

While the chemistries used for etching may vary, in one embodiment a hydroxide source, such as tetramethylammonium hydroxide (TMAH) or $NH_4OH$, as two examples, may be used to etch a polysilicon layer. Other chemistries may also be used to etch polysilicon layers.

Figure 1:
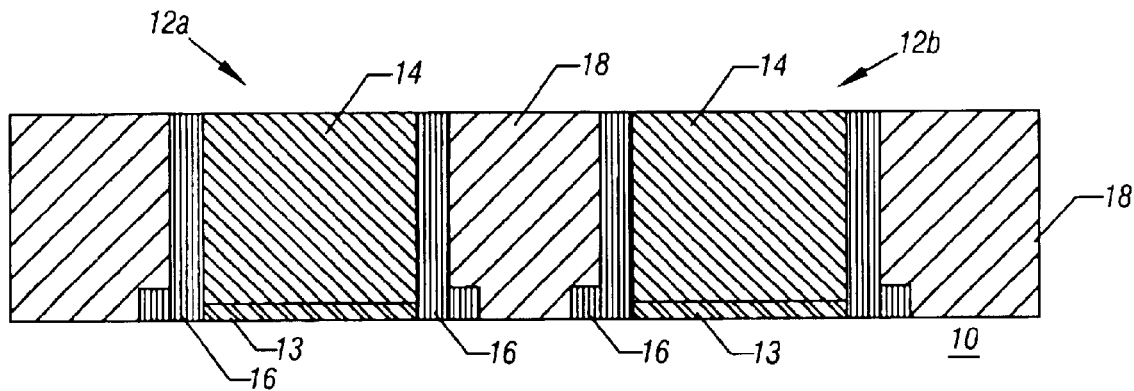
FIG. 1 is an enlarged cross-sectional view of one embodiment of the present invention at an earlier stage of manufacture.

Referring to FIG. 1, conventional NMOS and PMOS transistor structures 12a and 12b, respectively, may be formed on a semiconductor structure 10. Each transistor structure 12 may include a polysilicon gate 14 over a gate dielectric 13. A nitride spacer 16 may be formed on the sidewalls of the gate 14 and an interlayer dielectric 18 may be situated over the structure 10 outside of the spacer 16 in one embodiment.

To implement a dual metal complementary metal oxide semiconductor device, it is desirable to remove one polysilicon gate 14 and to selectively replace it with another metal. In one embodiment of the present invention the NMOS and PMOS transistor structures 12 may receive different gate metal material.

Figure 2:
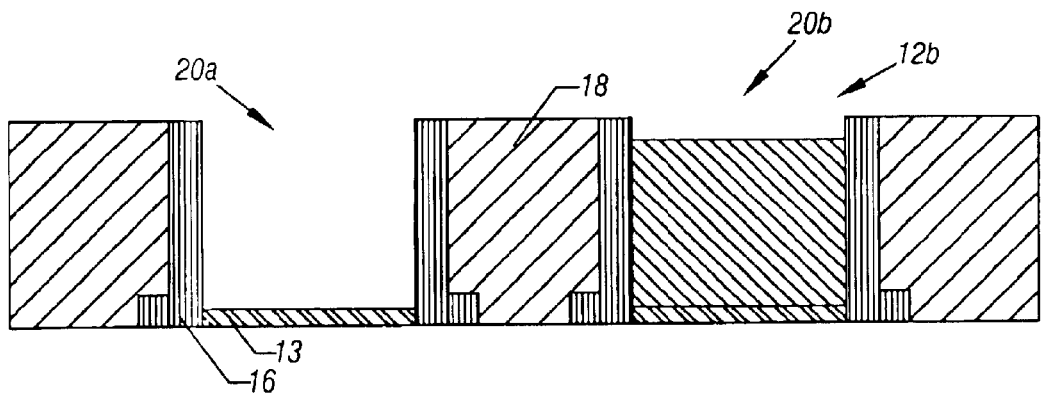
FIG. 2 is an enlarged cross-sectional view of the embodiment shown in FIG. 1 after further processing in one embodiment.

Referring to FIG. 2, the polysilicon gate 14 for the NMOS structure 12a has been removed by a selective etch which is highly selective relative to the p+ doped gate 14 of PMOS structure 12b, as well as to interlayer dielectrics, nitride spacers, metal gates, underlying gate oxides, silicon, and other high dielectric constant materials, to mention a number of examples.

The selective removal of the polysilicon gate 14 may involve using a 25 percent solution of tetramethylammonium hydroxide (TMAH) in one embodiment. In another embodiment tetraethylammonium hydroxide or another tetra (alkyl)ammonium hydroxide may be used. This etch, when coupled with sonic energy, is particularly selective of n-type doped polysilicon gate material. Thus, this embodiment is particularly applicable to removing the polysilicon gate 14 on the NMOS transistor structure 12a.

By making the polysilicon gates 14 taller than ultimately desired for both the NMOS and PMOS transistor structures 12, the slight etching, indicated at 20b, of the PMOS transistor 12b gate material 14 reduces the gate 14 height down to its desired height. As a result, the NMOS structure 12a may have its gate 14 removed and, even though the height of the gate 14 of the PMOS structure 12b is also reduced, it is reduced down to the ultimately desired height.

Figure 3:
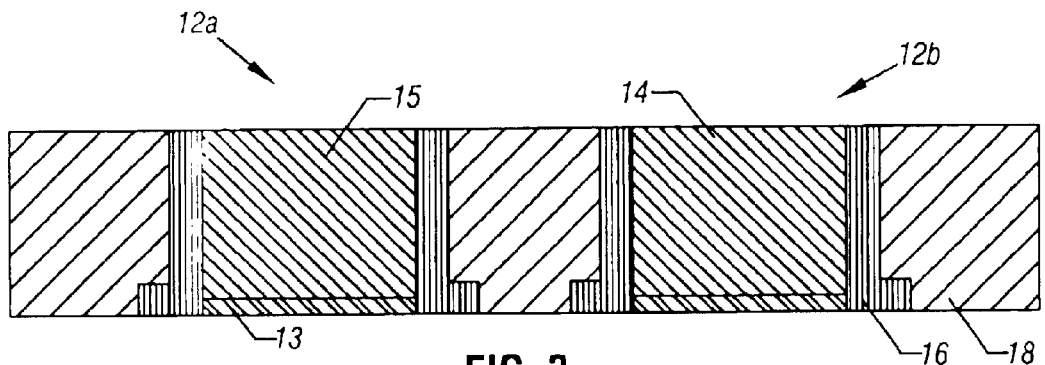
FIG. 3 is an enlarged cross-sectional view of the embodiment shown in FIG. 1 after further processing in one embodiment.

After the polysilicon gate 14 has been removed in the NMOS transistor structure 12a, a new gate material 15, such as a metal gate material, may be formed or deposited into the void 20a, in accordance with one embodiment of the present invention shown in FIG. 3. The entire structure, after a new metal is deposited, may be polished to reduce its height to correspond to the reduced height of the gate 14 of the PMOS transistor structure 12b.

Figure 4:
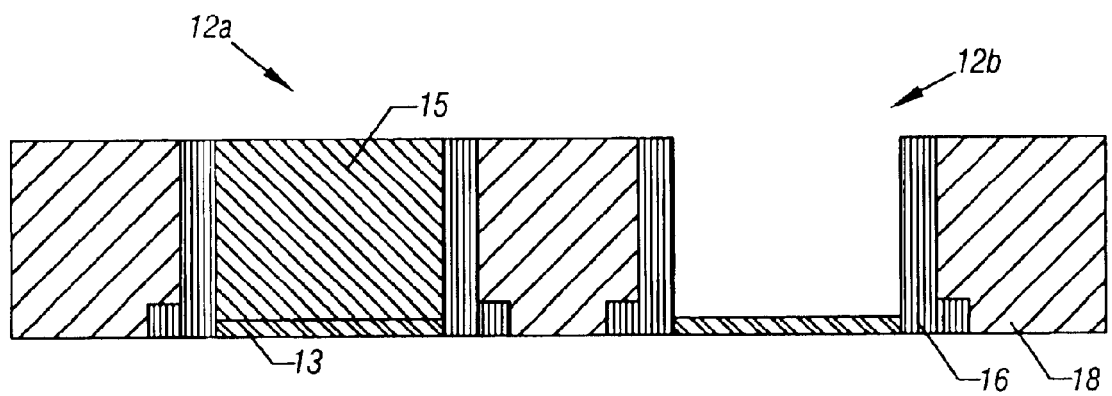
FIG. 4 is an enlarged cross-sectional view of the embodiment shown in FIG. 1 after further processing in one embodiment.
Figure 5:
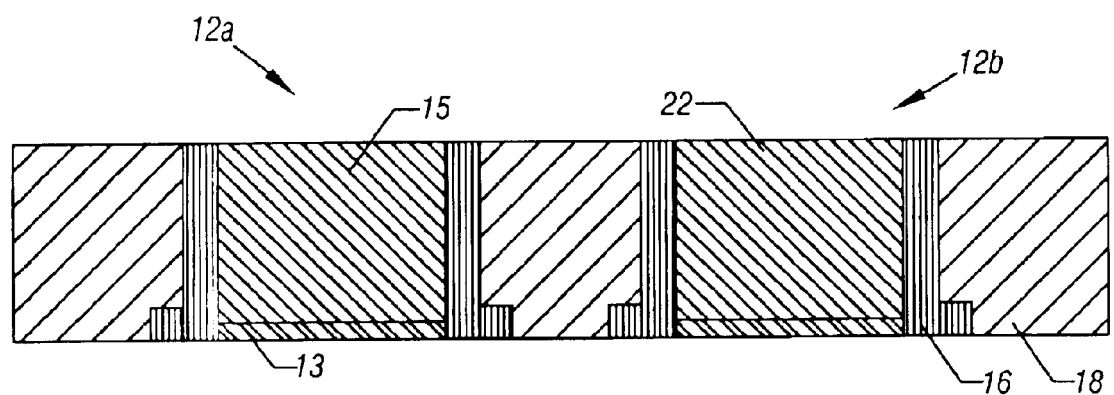
FIG. 5 is an enlarged cross-sectional view of the embodiment shown in FIG. 1 after further processing in one embodiment.

In some embodiments, the PMOS transistor structure 12b may be exposed and the p-type gate 14 may be etched away, as shown in FIG. 4, using any etchant that does not attack the replacement n-type gate material. In such an embodiment, no masking of the n-type gate material may be needed. The etchants described earlier may be used in some embodiments. The p-type polysilicon may then be replaced with a metal 22, as shown in FIG. 5.

Without sonication, the etch rate for n+ polysilicon is approximately twice the etch rate for p+ polysilicon. In other words, the etch rate between these polysilicon regions is not particularly selective.

With sonication, the etch rate for n+ polysilicon may be as great as 15 to 20 times the etch rate for p+ polysilicon in some embodiments. In other words, the etch rate between these polysilicon regions is very selective as a result of using sonication. In certain embodiments, sonication may increase the etch rate for n+ polysilicon tenfold. Thus use of sonication during etching causes a significantly increased etch rate for n+ polysilicon, but has no effect on the etch rate of p+ polysilicon.

This etching process may be completed, in some embodiments, with the PMOS gate exposed because of the high selectivity of n+ polysilicon. Referring to FIG. 3, as a result of the sonication, the n+ polysilicon gate 14 is completely removed, leaving the gate oxide layer 13 exposed. However, because of the reduced amount of time needed to etch the n+ polysilicon gate 14, as a result of sonication-induced selective etching, the p+ polysilicon gate 14 remains substantially intact.

Because of the high selectivity to NMOS polysilicon, the NMOS gate 14 of the complementary metal oxide semiconductor wafer may be removed without the need to protect the PMOS transistor structure 12b. This results in a savings in cost and time since additional masking would otherwise be required. This additional masking results in additional process steps which result in additional processing time and expense.

While an embodiment has been provided in which a dual metal gate technology is implemented, the present invention is not so limited. In fact, the techniques described herein may be utilized in a variety of semiconductor processing applications.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    enhancing etch selectivity of a material of one conductivity type relative to material of an opposite conductivity type using sonic energy.

2. The method of claim 1, further comprising using a hydroxide-based etchant for the etching.

3. The method of claim 1, further including obtaining a substrate wherein a first layer comprises a n+ polysilicon portion and a p+ polysilicon portion.

4. The method of claim 3, further including selectively etching and removing the n+ polysilicon portion of the first layer.

5. The method of claim 4, wherein the etching comprises selectively etching the n+ polysilicon portion while leaving the p+ polysilicon portion substantially intact.

6. The method of claim 1, wherein using sonic energy comprises providing sonic waves at a frequency between about 10 and 100 kHz.

7. The method of claim 1, wherein using sonic energy comprises providing sonic waves at a frequency between about 500 and 1000 kHz.

8. A method comprising:
    forming n-type and p-type doped polysilicon transistor structures;
    using a selective etch with sonication to remove the n-type doped polysilicon;
    reducing the height of the p-type doped polysilicon; and
    replacing the n-type doped polysilicon with another material.

9. The method of claim 8 including using a hydroxide based etchant to remove the n-type doped polysilicon.

10. The method of claim 9 including using sonic energy to increase the selectivity of said etchant.

11. The method of claim 10 including providing sonic waves at a frequency between about 10 and 100 kilohertz.

12. The method of claim 10 including providing sonic waves at a frequency between 500 and 1000 kilohertz.

13. The method of claim 8 including polishing after depositing another material to replace the removed n-type doped polysilicon.

14. The method of claim 8 including removing the n-type doped polysilicon while leaving the p-type doped polysilicon uncovered and exposed during the selective etching.

15. A method comprising:
    forming n-type and p-type doped polysilicon material on a semiconductor substrate;
    selectively removing the n-type doped polysilicon using sonication while leaving the p-type doped polysilicon uncovered;
    replacing the n-type doped polysilicon with another conductive material.

16. The method of claim 15 including an etchant that is selective of n-type doped polysilicon.

17. The method of claim 16 including using an hydroxide etchant.

18. The method of claim 17 including using sonication during etching.

19. The method of claim 15 including replacing said n-type doped polysilicon with a metal.

20. The method of claim 19 including slightly etching said p-type doped polysilicon material and using said slightly etched p-type doped polysilicon material as the gate of a p-type transistor.

21. The method of claim 20, including forming a metal gate material to the reduced height of the p-type doped polysilicon material after etching.

22. The method of claim 20, including removing the p-type doped polysilicon.

23. The method of claim 20, including removing said p-type doped polysilicon without masking another conductive material.

24. The method of claim 23, including replacing said p-type doped polysilicon with a metal.

25. The method of claim 15 including polishing the structure resulting after replacing the n-type doped polysilicon.

* * * * *